United States Patent
Lin

[11] 3,965,299
[45] June 22, 1976

[54] DYNAMIC MAGNETIC BUBBLE DISPLAY SYSTEM

[75] Inventor: Burn Jeng Lin, Shrub Oak, N.Y.

[73] Assignee: International Business Machines Corporation, Armonk, N.Y.

[22] Filed: May 9, 1975

[21] Appl. No.: 575,909

[52] U.S. Cl..................... 178/7.3 D; 315/169 TV; 340/324 R; 340/337; 340/174 TF; 340/174 YC; 350/151
[51] Int. Cl.²........................................... H04N 5/66
[58] Field of Search..................... 178/7.3 D, 7.5 D; 315/169 TV; 340/324 M, 174 TF, 174 YC, 324 R; 350/151, 147, 150

[56] References Cited
UNITED STATES PATENTS

| | | | |
|---|---|---|---|
| 3,460,116 | 8/1969 | Bobeck et al. | 340/YC |
| 3,526,883 | 9/1970 | Tabor | 340/174 YC |
| 3,893,023 | 1/1974 | Otala | 340/174 YC |

OTHER PUBLICATIONS
IBM Bulletin vol. 13, No. 12 May 1971 p. 3718.
IBM Bulletin vol. 15, No. 7 Dec. 1972 pp. 2213–2216.
IBM Bulletin vol. 13, No. 1, June 1970 p. 147.

*Primary Examiner*—Robert L. Richardson
*Attorney, Agent, or Firm*—John J. Goodwin

[57] ABSTRACT

A dynamic pattern display and optical data processing system is provided including magnetic bubble devices which may be operated in real-time to produce two and three dimensional patterns such as holograms, kinoform lenses and complex filters. Th display pattern is obtained by directing a linearly polarized light beam through a combination including a one-quarter waveplate, a plurality of two-dimensional magnetic bubble arrays and another one-quarter wave plate, all combined in a stack arrangement. In one embodiment a combination is provided which functions as a phase filter and in another embodiment including more bubble arrays, the combination functions as a phase and intensity filter. The display patterns are multi-phase or multi-tone (gray scale) and multi-phase in character. Each magnetic bubble array in the phase and phase and intensity filter embodiments constitutes a layer which differs in thickness from the other magnetic bubble layers. Each magnetic bubble array is also electronically driven by its own bubble propagating circuit which produces, in most embodiments, a different "local phase" or "local transmissivity" which is a function of whether a bubble or an empty space is propagated to the location. The number of levels of transmitted phase or intensity and phase is an exponential function of the number of magnetic bubble layers, thus n layers provides $2^n$ steps of transmitted phase or intensity and phase modification and a four layer structure provides a sixteen level phase or phase and intensity display. The electronic portion of the structure may be driven by signals representing mathematical expressions, patterns, manual inputs and the like to generate holograms, kineform lenses, complex filters, three-dimensional television pictures, and other display and optical information processing applications.

16 Claims, 6 Drawing Figures

DYNAMIC MAGNETIC BUBBLE DISPLAY SYSTEM

CROSS-REFERENCE TO RELATED APPLICATIONS

The present invention is related to the invention described in co-pending patent application Ser. No. 575,908 filed of even date herewith. Co-pending application Ser. No. 575,908 filed of even date herewith describes the use of magnetic-bubble domains to produce dynamic pattern displays using the Faraday effect to produce intensity modulation of light. In the present invention the magnetic bubble domains produce phase modulation to produce the displays and the combination of phase modulation and intensity modulation in a single device to produce displays.

BACKGROUND OF THE INVENTION

1. Field of the Invention

The present invention relates to the field of optical displays and data processing systems and more particularly to optical display and processing systems wherein the phase or phase and intensity of light passing through a structure is selectively and cynamically varied in accordance with information signals to produce a desired pattern for display or information processing.

2. Description of the Prior Art

The IBM Technical Disclosure Bulletin, published by the International Business Machines Corporation, Volume 13 No. 1, June 1970 at pg. 147 contains a publication entitled Bubble Domain Electronic-To-Optical Image Transducer by R. M. Craig et al which describes an arrangement of a single bubble domain in combination with a polarizer and an analyzer wherein the optical transparency of the bubbles is controlled by signals to the bubble generators to produce real-time spatial filters.

The present invention is distinct from the prior art in that a plurality of magnetic bubble arrays are combined and are separately electronically driven to produce a multitone (gray scale) display.

SUMMARY OF THE INVENTION

An object of the present invention is to provide an optical device which can be operated dynamically in real-time and which produces multi-level phase or phase and intensity image displays and performs optical information processing.

Another object of the present invention is to provide a dynamic display including a plurality of electronically variable magnetic bubble arrays combined in layers in which the local phase or phase and intensity of light passing through the arrays can be modified.

A further object of the present invention is to provide a dynamic magnetic-bubble display system for generating and manipulating holograms at electronic speeds.

Another object of the present invention is to provide a magnetic-bubble system for producing spatial intensity filters for real-time optical data processing.

Still another object of the present invention is to provide a magnetic-bubble display system for producing complex spatial filters for real-time optical data processing and for reconstructing three-dimensional video pictures.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1:
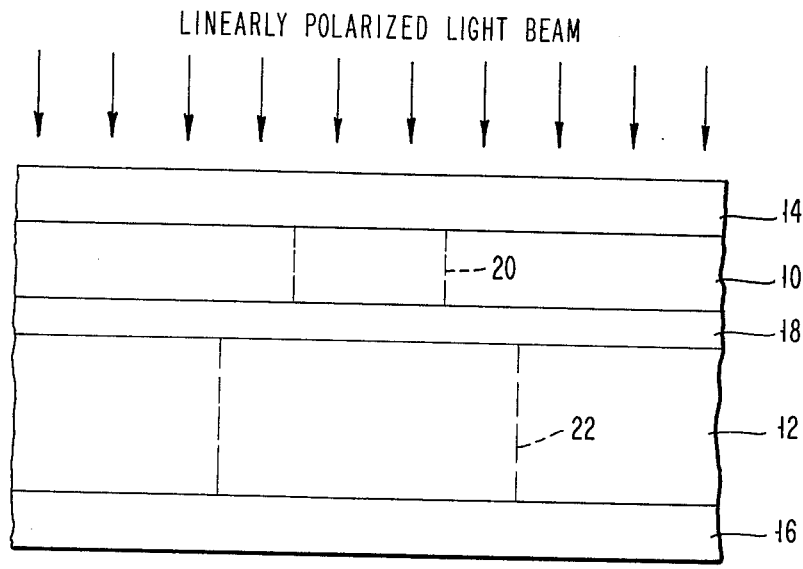
FIG. 1 is a schematic illustration of a side view of an embodiment of phase modifying two layer magnetic bubble array including one-quarter wave plates used as a four tone display system according to the principles of the present invention.

FIG. 1 is a schematic illustration of a two layer structure of magnetic bubble arrays of unequal thickness which are disposed between two one-quarter wave plates 14 and 16 and which, when linearly polarized light is transmitted therethrough, selectively modifies the phase of the light to produce an four-level phase image. Each magnetic bubble array or layer includes an orthoferrite platelet or garnet or amorphous film structure 10 and 12, and associated propagation circuits located in layer 18 which contains the permalloy bubble generators and annihilators. Propagation layer 18 includes a separate set of permalloy circuits for the magnetic bubbles of structure 10 and 12. Linearly polarized light 20 is directed through the multilayer structure of FIG. 1 from a suitable source 22. The thicknesses of each of the orthoferrite or garnet bubble structures 10 and 12, are unequal in accordance with selected design parameters and therefore the width of the magnetic bubbles produced in each of the structures 10 and 12, vary in size accordingly. The width of the bubbles in structures 10 and 12, are designated by sections 24 and 26 of FIG. 1.

One of the concepts of the present invention is to utilize the fact that the refractive index of circularly polarized light can be changed by magneto-optics materials and to employ magnetic bubble domains to selectively vary the phase of input light beams to produce displays and perform optical processing. In the publication "A Survey of Magnetooptic Effects" by M. J. Freiser, IEEE Trans. Magnetics, Vol. MAG-4, pp 152-161, June 1968 it is shown that when the direction of light is parallel to the direction of magnetization, the refractive index is [Eq. 1] $n_+ = k_1 \pm ik_2$ where + and − stand for right and left circularly polarized light respectively and $k_1$ and $k_2$ are elements of the relative electric permeability tensor.

$$k = \begin{bmatrix} k_1 & k_2 & 0 \\ -k_2 & k_1 & 0 \\ 0 & 0 & k_3 \end{bmatrix} \quad [\text{Eq. 2}]$$

The elements $k_1$ and $k_2$ are, in general, complex numbers while $k_1$ is an even function of magnetization M and $k_2$ is an odd function of M. For the first order approximation let $k_1 = a_R - ia_1$ [Eq. 3] and $k_2 = ib_1$ [Eq. 4] where $b_1$ is proportional to magnetization M. The real part of $k_2$ is neglected since negligible circular dichroism is assumed.

Substituting equations [3] and [4] into equation [1] results in $n_\pm = (a_R \mp b_1) - ia_1$ [Eq. 5].

Let the field of the incident circularly polarized light be $E_{in} = A(\hat{x} \pm i\hat{y}) \cdot e^{i(\omega t - k_0 z)}$ [Eq. 6] then, the field of the output light through the magneto-optics material is $E_{out} = A(\hat{x} \pm i\hat{y}) \cdot e^{-a_1 \kappa_0 z} \cdot e^{i(\omega t - a_R \kappa_0 z)} \cdot e^{\pm ib_1 \kappa_0 z}$ [Eq. 7]. It is obvious from equation [7] that $a_1$ gives a constant absorption and $b_1$ gives a phase shift proportional to the magnetization M. Therefore, as shown in FIG. 1, a quarter-wave plate 14 is used to circularly polarize the incoming linearly polarized light. The light which emerges from bubble layer 12 is circularly polarized and the refractive index is modified as designated. The use of a second quarter-wave plate 16 again linearly polarizes the light if such is desired, however in some instances the second quarter-wave plate 16 in FIG. 1 may be omitted.

Thus, in accordance with the preceding discussion, when light is transmitted through magnetic bubbles it is phase modified by the Faraday effect, and it is known that the amount of phase modification is proportional to the thickness of the bubble material. The levels of phase modification of the transmitted light is an exponential function of the number of layers of the bubble material. In the present invention, where $n$ layers of selected, unequal thickness bubble material is employed, the phase of the transmitted light is varied in steps exponentially as a function of $2^n$. Consequently a two layer device provides ($2^2$) four steps of phase change to provide a four tone grey scale. A three layer device provides a $2^3$ or eight level phase image and a four layer device provides a sixteen level phase image.

In FIG. 1, the propagation circuits in layer 18 are responsive to electronic signals and, in accordance with conventional bubble device techniques, generate the independent but related magnetic bubble patterns, in each of the bubble structures 10 and 12.

When the linearly polarized light is transmitted through each of the magnetic bubble structures 10 and 12, the polarization of the light is varied in different amounts in accordance with the particular thickness of the magnetic bubble layer and each magnetic bubble layer contributes a different level of grey scale such that the light passing through the entire multilayer structure of FIG. 1 provides a visual display of the generated pattern having a four tone grey scale. As will be later more fully described, the electronic signals which drive the propagation current circuits on layer 18 can be dynamically varied to produce changes in the bubble patterns in real time to produce a dynamic or moving display. That is, the magnetic bubbles in layers 10 and 12 are used to individually control the optical phase at arbitrary points in a two-dimensional plane, thus, enabling generation of phase holograms and kinoform lenses at electronic speed.

Although the dimensions of the various layers of the device of FIG. 1 can be selected for the desired application, it has been found that when orthoferrites are employed as the magnetic bubble material in the case of hologram displays, that thickness values of approximately 35 microns and 55 microns, can be used for layers 10 and 12, respectively with propagation circuit layer 18 being approximately 5 microns thick. These dimensions result in bubble widths of approximately 75 microns and 100 microns, for widths 20 and 22 respectively.

Figure 2:
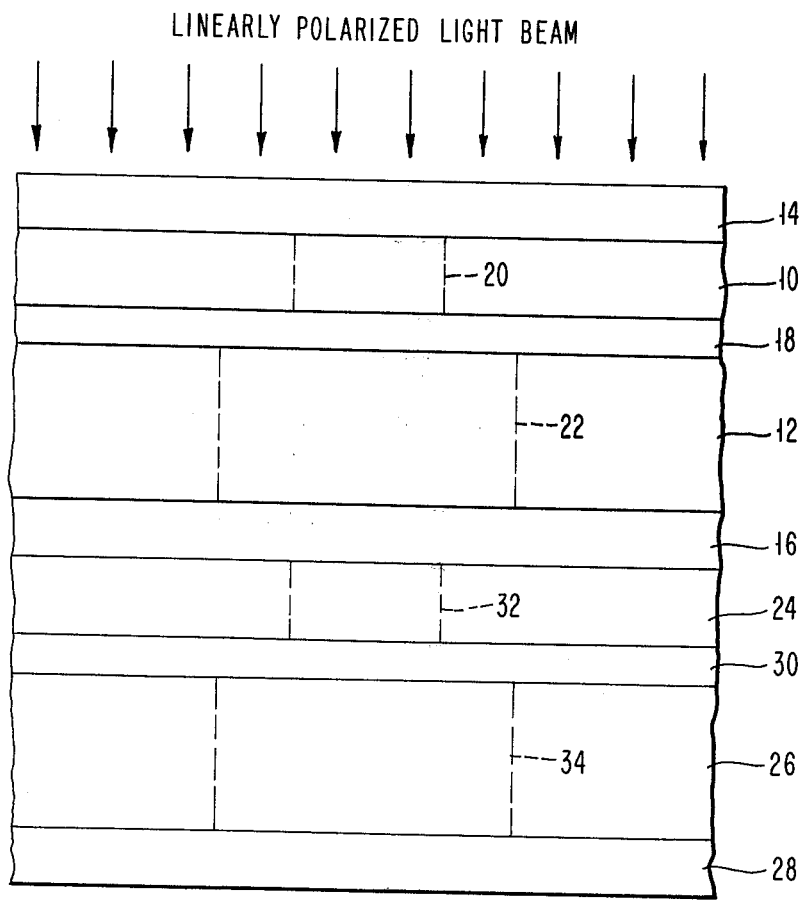
FIG. 2 is a schematic illustration of a side view of an embodiment of a phase and intensity modifying four layer magnetic bubble array including one-quarter wave plates and a polarization analyzer used as a sixteen tone display system according to the principles of the present invention.

FIG. 2 is a schematic illustration of another embodiment of the present invention wherein multi-tone displays are produced using a magnetic bubble domain structure incorporating both phase modification and intensity modification. In FIG. 2 the elements designated by reference numbers 10, 12, 14, 16, 18, 20 and 22 are the same as shown and described relative to FIG. 1. That is, in FIG. 2, the incoming light is linearly polarized and undergoes phase modification as a result of quarter-wave plate 14, bubble domain layers 10 and 12 and is returned to linear polarization by quarter-wave plate 16. The information by which the incoming light is modified is a function of the individual arrangements of the bubble domains 20 and 22 in layers 10 and 12 as determined by the propagation circuits in layer 18 which are driven by suitable electronic signals.

After the light has passed through elements 14, 10, 12 and 16 the light is linearly polarized and phase modified in accordance with the pattern of the bubble domains in layers 10 and 12. Also, the light is disposed in a multi-level two dimensional phase pattern of $2^n$ or four levels of phase gradation. This light then passes through the structure consisting of the elements 24, 30, 26 and 28. This structure functions in the same manner as that described in co-pending application (IBM Docket Y09-74-001) which is incorporated herein by reference. Elements 24 and 26 are bubble domain layers, the individual bubble domains of which are propagated and controlled by circuits in layer 30. The bubble domains in layers 24 and 26 are caused to be arranged in patterns which modify the linearly polarized light, however the light is intensity modified by Faraday rotation in each layer by the bubble domains arranged in patterns to produce a further modification in the form of multi-tone intensity level pattern. Since there are two layers 24 and 26 shown in the specific embodiment of FIG. 2, there will be $2^n$ of four additional levels of tone provided so that a total of $2^4$ multi-tone pattern or sixteen grey scale pattern is produced. Element 28 is a polarization analyzer through which the light passes to provide a resultant linearly polarized multi-tone display pattern or image.

Figure 3:
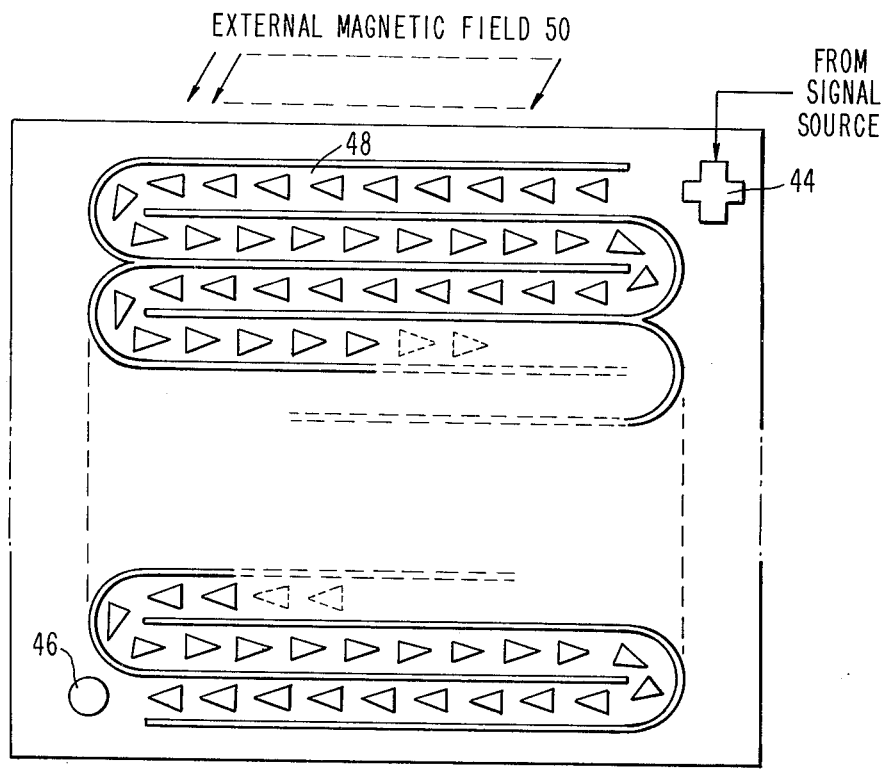
FIG. 3 is a schematic illustration of an angelfish bubble arrangement which may be employed in the present invention.

FIG. 3 is a schematic illustration of one form of magnetic bubble structure and propagation current circuit which may be employed in the device shown in either FIG. 1 or FIG. 2. The magnetic bubble structure illustrated in FIG. 3 is generally referred to as an "angel fish" circuit. Angel fish propagation circuits, and magnetic bubble technology in general is described in a publication entitled *Magnetic Bubbles* by Andrew H. Bobeck and H. E. D. Scovil which appears in the June 1971 issue of *Scientific American*, pages 75–90. Another descriptive publication is *Application of Orthoferrites to Domain-Wall Devices* by Andrew H. Bobeck et al which appears in *IEEE Transactions on Magnetics*, Vol. MAG 5, No. 3, September 1969, pp. 544-553.

In the angel fish circuit of FIG. 3 a permalloy generator 44, a permalloy annihilator 46 and a permalloy sequence of arrowheads 48 which form a part of the propagation current circuit means 18 or 20 (FIG. 1) are disposed on an orthoferrite magnetic bubble wafer (structure 10, 12, 14, 16, of FIG. 1). An external magnetic field 50 is raised and lowered rhythmically to make the bubbles alternately contract and expand. Each time a bubble contracts it slides off the tip of the trailing arrowhead. With each expansion the bubble slides onto the next arrowhead in line. Each bubble therefore progresses through the total array until it is eliminated by annihilator 46. By proper application of input current to generator 44 a sequence of bubbles can be produced over the entire array of FIG. 3 to produce desired patterns which also can be varied in real time. Because the bubbles must progress through the entire array, and because only one generator and one annihilator are required, the arrangement of FIG. 3 is relatively slow but simple in construction.

Figure 4:
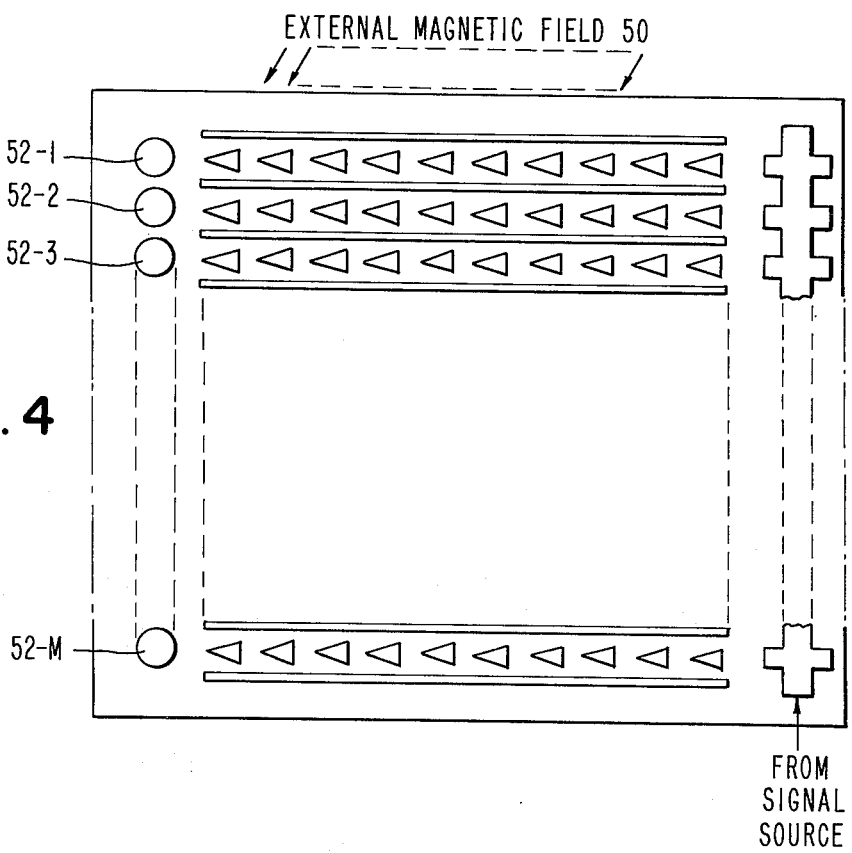
FIG. 4 is a schematic illustration of another angelfish bubble arrangement which may be employed in the present invention.

FIG. 4 illustrates another angelfish bubble arrangement which is faster but slightly more complex than the arrangement of FIG. 3. In FIG. 4 the generator 52 produces bubbles along a plurality of separate lines, each line being terminated with a separate annihilator 52-1 through 52-n. The circuit of FIG. 4 operates on the same principles as that of FIG. 3 except that each line of the pattern is separately generated and the bubbles have to propagate only across the layer rather than through both dimensions of the layer so the arrangement of FIG. 4 results in a faster display.

The arrangements shown in FIGS. 3 and 4 are known prior art configurations which may be employed in the present invention. Other bubble techniques such as T-bar, Y-bar and the like can also be used in the present invention.

If T-bar propagation circuits are desired, some modification of the multi-layer structures as shown in FIG. 1 and FIG. 2 are suggested. In angel fish circuits the bubbles propagated in different layers run in different directions which for T-bar propagation would require off set scaling in the upper and lower layers of the propagation circuits or locating the circuit for each bubble layer in separate propagation layers associated with each bubble layer.

As previously stated, the present invention may be embodied in a number of different ways as a real-time device to produce holograms, kinoform lenses and complex filters for display or image processing.

The structures shown in either FIG. 1 or FIG. 2 can be used for optical data processing operations or visual displays. For optical data processing applications where no human observation is included, the functions of holographic spatial complex filtering dynamically spatial intensity filtering can be performed by the structure of FIG. 1 or FIG. 2 using garnet or amorphous bubble material for arrays 10, 12, 14 and 16 with angel fish or T-I bar type bubble propagation. In the case of display systems for human observation the structures of FIG. 1 or FIG. 2 can be used in combination with orthoferrite platelets alone or with garnet or amorphous materials in combination with conventional lenses and analyzer. One form of possible display is the three-dimensional display produced by a two-dimensional hologram which is formed by magnetic bubbles using the structure of either FIG. 1 (for a phase hologram) or FIG. 2 (for a phase and intensity hologram) wherein the bubbles are propagated according to FIG. 3 or FIG. 4. Magnetic holograms are discussed in the publication *Reconstruction Effects in Magnetic Holography* by Reuben S. Meyrich, *IEEE Transactions on Magnetics*, Vol. MAG 6, No. 3, September 1970, pp. 537 to 541. This publication states that magnetic holography is a storage method based on the combination of techniques of magneto-optics and holography and has features which are unique to either of these techniques, and that reconstruction may be obtained with the Faraday effect, using polarized or unpolarized light with the magnetic hologram behaving like a phase hologram. More particularly, the intensity and phase of the first order diffracted beam which is the reconstructed beam is already modified by Faraday rotations (produced by the magnetic bubbles in the present invention) and is spatially separated from the unmodified zero order beam. Therefore, linearly polarized illumination and a viewing analyzer are not required for hologram type displays.

Figure 5:
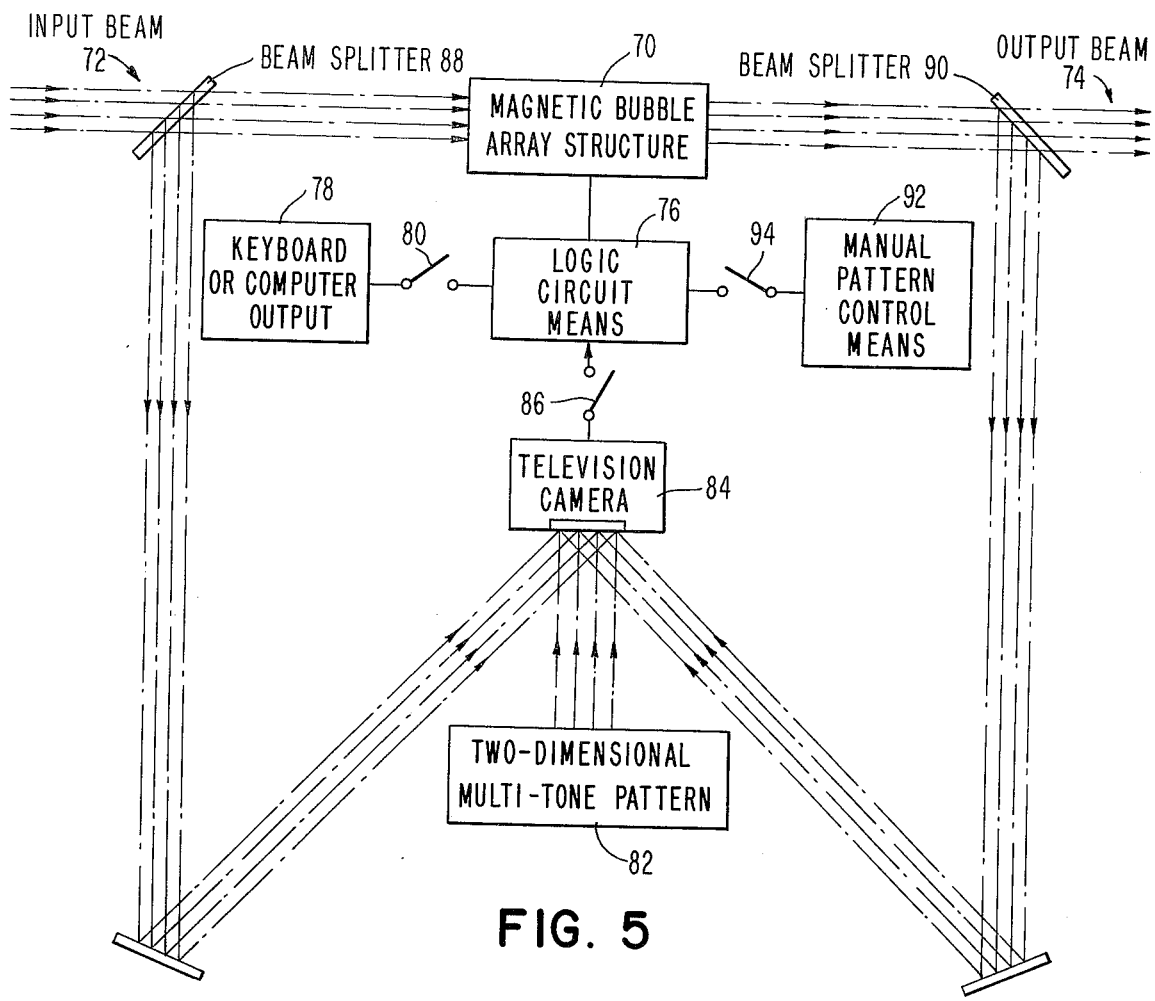
FIG. 5 is a block diagram illustration of an embodiment of an optical data processing system employing the principles of the present invention.
Figure 6:
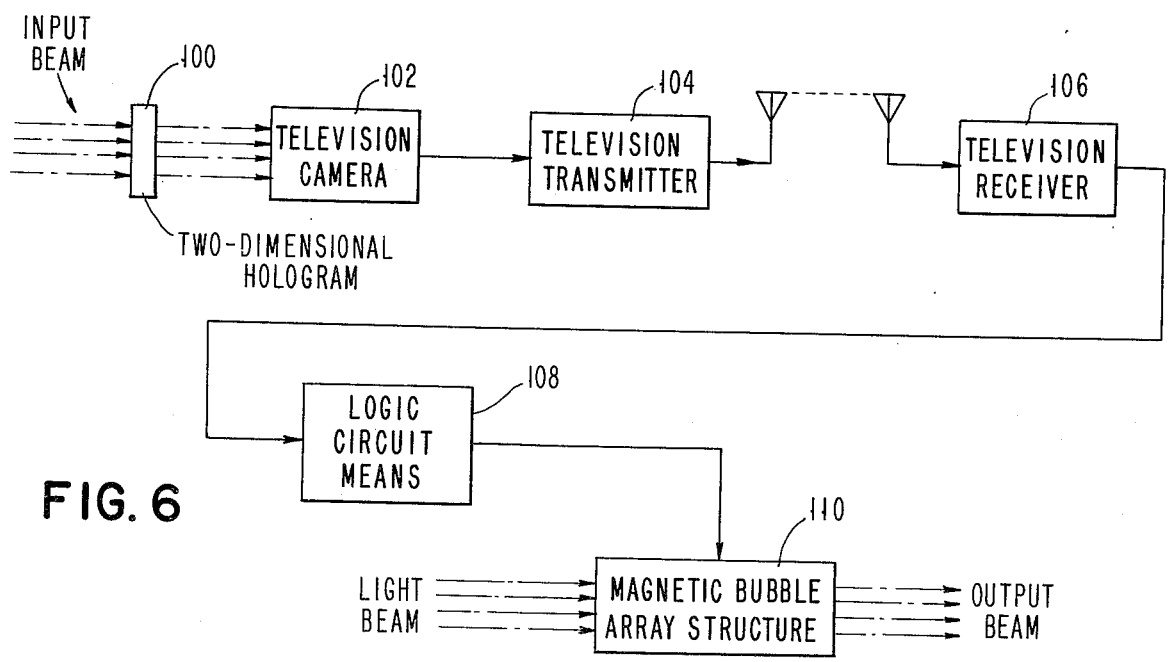
FIG. 6 is a block diagram illustrative of an embodiment of an optical data processing system for providing two and three dimensional displays.

The structures of FIGS. 1 and 2 embodying the propagation schemes of FIGS. 3 and 4 as well as T-bar and Y-bar configurations can be incorporated in systems for optical data processing and display, examples of which are illustrated in the schematic block diagrams of FIG. 5 and FIG. 6.

In FIG. 5 a system is shown employing the phase modifying or phase and intensity modifying magnetic-bubble structure in an optical data processing environment. A magnetic-bubble structure 70 according to FIGS. 1 or 2 is disposed in the path of an input light beam 72.

Input beam 72 may or may not have information bearing (image) content depending upon the system application. Input beam 72 is directed through magnetic bubble structure 70, which functions as a phase hologram, spatial complex filter or kineform lens in a manner to be described, and emerges as an optically processed output beam 74.

The particular type of optical processing performed on input beam 72 by magnetic bubble array structure 70 depends on the input signals applied to its bubble generation and propagation circuit. The input signals to magnetic bubble array structure 70 are applied through logic circuit means 76 and are derived from four possible origins. The patterns may be generated by means of a keyboard or from a computer output as represented by block 78. It is well known that patterns such as complex filters can be generated and stored in digital form, and that such digital information signals can be read out and converted into optical form. Thus, by means of block 78 the mathematical expressions for desired patterns can be generated on a keyboard or obtained from a computer and applied through a switch 80 to logic circuit 76 which converts the signals into the proper form to be applied to each of the layers of the magnetic bubble structure 70 to generate and propagate the pattern in the form of a two-dimensional magnetic bubble array which interacts with and optically processes (i.e. spatially or intensity filters) input beam 72 which thereafter can be utilized as output beam 74.

In a second or different mode of operation the pattern to be generated on magnetic bubble array structure 70 may be obtained from a preexisting two-dimensional multi-tone pattern 82. In this mode of operation the pattern 82 is optically detected by a conventional television camera which converts the pattern into an electronic raster video signal which is applied through switch 86 and logic circuit means 76 to drive the bubble generation and propagation means of magnetic bubble array 70 to form a multilayer grey scale bubble configuration of the pattern 82 in a manner described with reference to FIG. 1 and FIG. 2.

It is also possible to operate the system in the second mode such that the pattern 82 applied through television camera 84 to logic circuit means 76 is itself modified or processed, for example by signals from keyboard 78 applied to logic circuit means 76 through switch 80, before it is applied to magnetic bubble array structure 70. Thus, the pattern 82 can undergo electrical signal processing as well as optical signal processing.

In a third mode of operation, a pattern or image carried by input beam 72 may be applied to television camera 84 applies the image in video signal form to logic circuit means 76 which drives the generation and propagation means of magnetic bubble array structure 70 which in turn produces an image of the pattern on input beam 72 in magnetic bubble form which will interact with and process the original image. An example of processing in this mode would be autocorrelation. Again, the video signals representative of the original image may also be modified in logic circuit means 76 by applying a function from keyword 78 such that the original image on input beam 72 is processed by a modified version of the same image in a bubble array configuration in magnetic bubble array structure 70.

Similarly, in a fourth mode, the pattern applied to television camera 84 may be the processed pattern image on output beam 74 which may be obtained and applied back through a beam splitter and may or may not be modified prior to being applied to magnetic bubble array structure 70 by keyboard 78.

From the preceding discussion, it can be appreciated that the pattern produced by magnetic bubble array structure can be obtained not only from input beam 72, keyboard or computer output 78, two-dimensional pattern 82 and output beam 74 applied individually, but also by any combinations of two or more of such sources applied at the same time to form a resultant signal to magnetic bubble array structure 70 modified as desired. For these purposes a scanning optics system such as a rotating mirror can be located in front of television camera 84, the rotation of which is synchronized with the scan rate of the television camera so that combinations of input beam 72 output beam 74 and pattern 82 can be selectively applied to television camera optics system such as a rotating mirror can be located in front of television camera 84, the rotation of which is synchronized with the scan rate of the television camera so that combinations of input beam 72 output beam 74 and pattern 82 can be selectively applied to television camera 84 on a time-shared basis.

An additional feature is incorporated in the system of FIG. 5 as manual pattern control means 92. In certain applications it may be desirable to provide the operator with pattern controls such as vertical shift, horizontal shift, rotation, contraction expansion and the like. Thus, manual pattern control means 92 is provided to selectively apply such suitable signals to the system through switch 94.

The arrangement depicted in FIG. 5, therefore, provides a versatile system for optical processing of an input beam with a number of possible modes of operation to effect a large number of desired results.

Referring to FIG. 6, a system is shown which can provide either a two or three dimensional display listed in the table previously set forth herein. In the system of FIG. 6 an illuminated two dimensional hologram 100 produces an image which is received by a conventional television camera 102 which in turn sends the video signal to a remote location via a conventional television transmitter 104 and television receiver 106. At the remote location the video signals from the television receiver are applied to logic circuit means 108 where they are converted into proper form to be applied to the generation and propagation means for each of the layers of a magnetic bubble array structure 110 similar to those shown in FIG. 1a and FIG. 2. The magnetic bubble array structure 110 responds in a manner previously described to produce a corresponding hologram pattern formed by layers of magnetic bubbles.

A monochromatic polarized light beam which bears no information is directed through the magnetic bubble hologram to produce an output beam which carries a three-dimensional holographic image which can be viewed by an observer.

In the description of FIGS. 5 and 6 the logic circuit means 76 and 108 were described as units which accept electronic signals from keyboard or computer output 78, television receiver 106 and modify the signals such that separate signals in proper form can be applied to the permalloy generators for each of the layers of the multitude of two-dimensional magnetic bubble arrays. Although not shown in specific detail, logic circuit means 76 and 108 as well as keyboard or computer output 78 and manual pattern control means 92 are believed to be either presently available or else well within the skill of a logic circuit design engineer to fabricate.

What has been described are novel optical data processing and display systems which may be operated in real-time to produce multi-phase or multi-intensity and multi-phase two dimensional patterns or a three dimensional holographic image. An important feature of the systems is the use of novel two-dimensional magnetic bubble arrays combined in a stack arrangement which produce multi-level intensity and/or phase patterns. The systems can incorporate various combinations of elements to provide a number of different functions within the optical data processing and display art including spatial complex filtering, spatial intensity filtering, three-dimensional holographic displays and two-dimensional intensity displays.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An optical processing and display device for producing multi-level phase images comprising:
    a plurality of separate magnetic bubble array layers arranged in a stack, said magnetic bubble array layers being each of a different thickness, each of said magnetic bubble array layers being composed of material that supports magnetic bubble domains which are movable in predetermined paths in said array, electrical signal means connected to each of said magnetic bubble array layers for selectively propagating magnetic bubble domains through said predetermined paths of said layers, said magnetic bubble domains selectively propagated through said paths of said layers having dimensions proportional to and determined by the thickness of the layers in which they are propagated such that the bubble domains in the separate layers of bubble arrays in said stack are of different predetermined sizes, a one-quarter wave plate layer disposed on one side of said stack of said magnetic bubble array layers, and means for directing linearly polarized light through said one-quarter wave plate and said stack of bubble array layers, phase of the linearly polarized light directed through said stack of bubble array layers being modified a different amount by each layer of the bubble domains in each layer in accordance with the thickness of the bubble domains in each layer to produce a phase modified multi-level circularly polarized light image corresponding to said selectively propagated magnetic bubble domains.

2. An optical processing and display device for producing multi-level phase images according to claim 1 further including a second one-quarter wave plate disposed on the other side of said stack of magnetic bubble array layers to change said circularly polarized multi-level phase modified light image into a linearly polarized multi-level phase modified light image.

3. An optical processing and display device according to claim 2 for producing multi-level phase and intensity images further including:

a second plurality of separate magnetic bubble array layers arranged in a stack and disposed on said second one-quarter wave plate of said magnetic bubble array layers of said second plurality being each of a different thickness, each of said magnetic bubble array layers of said second plurality being composed of material that supports magnetic bubble domains which are movable in predetermined paths in said array, electrical signal means connected to each of said second plurality magnetic bubble array layers for selectively propagating magnetic bubble domains through said predetermined paths of said layers, said magnetic bubble domains selectively propagated through said paths of said second plurality of layers having dimensions proportional to and determined by the thickness of the layers in which they are propagated such that the bubble domains in the separate layers of bubble arrays in said second plurality are of different predetermined sizes, wherein said linearly polarized multi-level phase modified light image from said second one-quarter wave plate is directed through said second plurality of bubble array layers and wherein the intensity of transmission of the polarized light directed through said second plurality of bubble array layers is varied a different amount by each layer of the bubble domains in each layer in said second plurality in accordance with the thickness of each layer to produce a resultant multi-level phase and intensity image.

4. An optical processing and display device according to claim 1 wherein said magnetic bubble array layers have magnetic bubble generators and annihilators associated therewith, said magnetic bubble generators being connected to said electrical signal means for generating magnetic bubble domains in said layers in response to the signals from said electrical signal means.

5. An optical processing and display device according to claim 1 wherein said electrical signal means includes angel fish propagation circuits.

6. An optical processing and display device according to claim 1 wherein said electrical signal means includes T-bar propagation current circuits.

7. An optical processing and display device according to claim 1 wherein said magnetic bubble array layers are composed of garnet material.

8. An optical processing and display device according to claim 1 wherein said magnetic bubble array layers are composed of orthoferrite material.

9. An optical processing and display device according to claim 1 wherein said magnetic bubble array layers are composed of amorphous material.

10. An optical processing and display device according to claim 1 wherein the phase of said light directed through said stack of magnetic bubble arrays is modified by the Faraday effect in accordance with the thickness of each magnetic bubble layer and is varied in phase by said Faraday effect in steps exponentially as a function of $2^n$ wherein is the number of magnetic bubble layers in said stack.

11. An optical processing and display device according to claim 1 wherein a single magnetic bubble generator is connected to each of said magnetic bubble arrays at one corner of each array to selectively produce magnetic bubble domains which move sinuously from said one corner to the diagonally opposite corner of each array to produce a two dimensional magnetic bubble pattern in each array, and wherein a bubble annihilator is connected to each of said magnetic bubble arrays at said diagonally opposite corner.

12. An optical processing and display device according to claim 1 wherein a plurality of magnetic bubble generators are connected to each of said magnetic bubble arrays along one edge of said arrays to selectively produce magnetic bubble domains which move in rows across each array to produce a two-dimensional magnetic bubble pattern in each array, and wherein a plurality of bubble annihilators are connected to each of said arrays along the edge of each array opposite said bubble generators and at the end of said rows.

13. An optical processing and display system comprising:

a magnetic bubble array structure including a plurality of separate magnetic bubble array layers arranged in a stack, said magnetic bubble array layers being each of a different thickness, each of said magnetic bubble array layers being composed of material that supports magnetic bubble domains which are movable in predetermined paths in said array to produce a two-dimensional pattern of magnetic bubble domains in each array layer, said magnetic bubble domains selectively propagated through said paths of said layers having dimensions proportional to and determined by the thickness of the layers in which they are propagated such that the bubble domains in the separate layers of bubble arrays in said stack are of different predetermined sizes, and further including magnetic bubble generating means connected to each of said magnetic bubble array layers for selectively propagating magnetic bubble domains through said predetermined paths of said layers, a one-quarter wave plate layer disposed on one side of said stack of magnetic bubble array layers, means for directing linearly polarized light through said one-quarter wave plate and said stack of bubble array layers, the phase of the polarized light directed through said stack of bubble array layers being varied a different amount by the bubble domains in each layer of said stack in accordance with the thickness of each layer to produce an optical multi-level phase modified pattern representative of the two-dimensional pattern of said magnetic bubble domains in said layers, logic circuit means having an output connected to said magnetic bubble generating means for providing electrical signals to said generating means connected to said magnetic bubble layers in said stack to produce patterns of magnetic bubble domains in each of said layers of said stack for varying said polarized light directed through said stack, and a plurality of signal generating terminals selectively connected to the input of said logic circuit means for individually providing signals to said logic circuit means representative of two-dimensional patterns.

14. An optical processing and display system according to claim 13 wherein one of said signal generating terminals is a computer keyboard terminal capable of producing digital signals representative of two-dimensional patterns in response to key operation by a human operator.

15. An optical and display system according to claim 13 wherein one of said signal generating terminals is a television camera capable of producing electronic video signals representative of two-dimensional patterns presented in optical form to the lens of said camera.

16. An optical processing and display system according to claim 13 wherein one of said signal generating terminals is a manual pattern control means for generating and providing signals to said logic circuit means for modifying the scale and orientation of the two dimensional optical multi-tone patterns produced by said magnetic bubble array structure.

* * * * *